United States Patent [19]

Petke et al.

[11] 4,025,346

[45] May 24, 1977

[54] PLATES COMPRISING A PHOTOPOLYMERIZABLE COMPOSITION COATED ON A SUBSTRATE

[75] Inventors: Frederick Edward Petke, Cincinnati; John Nicholas Kirch, Blue Ash, both of Ohio; Michael Edward Gerkin, Florence, Ky.

[73] Assignee: Borden, Inc., Columbus, Ohio

[22] Filed: Dec. 31, 1975

[21] Appl. No.: 645,481

[52] U.S. Cl. .................... 96/86 P; 96/115 R; 96/87 R; 96/85; 96/35.1; 204/159.14; 204/159.15; 204/159.16; 204/159.19; 260/869; 260/872

[51] Int. Cl.² .................... G03C 1/94; G03C 1/68; C08F 8/00

[58] Field of Search ............ 96/86 P, 67, 87 R, 85, 96/115 R, 115 P; 204/159.14, 159.15, 159.16, 159.19; 260/869, 872

[56] References Cited

UNITED STATES PATENTS

| | | | |
|---|---|---|---|
| 3,674,444 | 3/1972 | Borden et al. | 96/86 P |
| 3,804,735 | 4/1974 | Radlove et al. | 204/159.23 |
| 3,923,523 | 12/1975 | Nishikubo et al. | 96/115 P |

*Primary Examiner*—Jack P. Brammer
*Attorney, Agent, or Firm*—George A. Kap; George P. Maskas; Daniel D. Mast

[57] ABSTRACT

A printing plate is coated with a composition comprising 20 to 50% saturated halogenated polyester, 10 to 45% polyacrylate, 5 to 15% metal acrylate and an effective amount of photoinitiator. The composition is applied in the form of a dispersion of the components in an inert organic solvent.

13 Claims, No Drawings

PLATES COMPRISING A PHOTOPOLYMERIZABLE COMPOSITION COATED ON A SUBSTRATE

This invention relates to plates comprising a substrate and a photopolymerizable coating composition thereon. More specifically, the novel aspects disclosed herein relate to a negative working plate for offset printing where the light affected areas are hardened and remain as the resist after development of the plate as compared to positive working printing plates where these areas are washed out during development. The areas remaining are generally called photoresist or stencil. Other applications for the invention described herein are also possible, such as printed circuits.

The negative precoated printing plate has advantages over the positive system by being cleaner during processing. What is referred to herein as dirt is normal dirt, type lines, film edges, etc., which do not constitute the problem they are in positive system where the dirt must be abraded from the coated plate. Furthermore, it is generally considered cheaper to prepare negative film than positive film in the camera shop.

Offset printing is a type of lithography which is based on the principle that oil and water do not readily mix. The printing and nonprinting areas in lithography are substantially on the same level with the printing area being ink-receptive and nonprinting area being water receptive. The image is transferred from the ink receptive area rather than from raised surfaces, as in the case of letterpress, or from depressed surfaces, as in gravure.

The substrate of a printing plate can be made of a metal such as aluminum, copper, chromium, zinc, magnesium, steel or any other suitable metal as well as of plastic and specially processed paper. Thickness of the substrate generally varies between 0.009 and 0.018 of an inch with planar dimensions of about 58 by 80 inches. The lithographic plate can also be bimetal or trimetal. In the case of bimetal plates, a coating of about 0.0001 of an inch of copper is plated over the substrate before it is coated with the coating composition described herein. This means that a substrate, which can be stainless steel, aluminum or other metals, paper or plastic, is electroplated with a thin layer of copper which is also a printing surface. In trimetal plates, the top metal layer is generally chrome. Example of a trimetal plate is one consisting of stainless steel, copper and chrome. The coating described herein is applied to copper or to chrome or it may be applied directly to the base substrate to make a short run plate.

The printing plate is prepared by applying a light-sensitive chemical coating to the surface of a substrate and the image is produced photographically. The thickness of the coating is from about 5 to 15 mils. After the plate is developed, the non-image area of the coating is removed and the plate is then chemically treated so that the image area becomes ink receptive and the non-image area becomes water receptive.

Lithographic inks generally are very strong in color value to compensate for the thin films applied by this printing process. The average ink application is generally thinner than used in the letterpress printing process. Pigments used in lithographic inks must be non-bleeding in presence of fountain solutions and vehicles must be resistant to excessive emulsification.

Prior art has produced negative working precoated lithographic plates which have involved the use of objectionable solvents for developing after exposure, high temperature baking after applying the coating to the plate or have given rise to serious performance problems.

We have developed plate coatings which do not require hig temperature baking, do not require objectionable solvents and which have performed very satisfactorily through plate preparation, exposure, development, finishing and press performance. We have found that specially prepared polyester resins, along with polyacrylate esters, plus photoinitiators and other modifiers in the proper solvent system, produce coatings which can be applied to various printing plate substrates, and after solvent evaporation, these coated plates can be converted to excellent negative working lithographic plates by the usual method of exposure to ultraviolet light, development with a special developer, etching, gumming and inking.

The coating composition includes the following components in a suitable solvent, based on the total weight of active components listed below:

a. 20 to 50%, preferably 25 to 40%, of a benzene-type saturated halogenated polyester,
b. 10 to 45%, preferably 15 to 30%, of a polyacrylate,
c. 5 to 15%, preferably 6 to 10%, of a metal acrylate, and
d. an effective amount of a photoinitiator.

The halogenated polyester is a reaction product of a halogenated benzene-type polycarboxylic acid or its anhydride with polymerized styrene-alkyl alcohol or an alkylene polyhydroxy compound containing from 2 to 6, preferably from 2 to 4, reactive hydroxyl groups per molecule and a total of 2 to 22, preferably 2 to 6, carbon atoms per molecule. The alkylene moiety of this compound contains from 2 to 12, preferably from 2 to 6 carbon atoms. The reaction is carried out by reacting an equivalent of the acid or anhydride with about an equivalent of the polyhydroxy compound. Preferred acids are the dicarboxylic acids which contain one phenyl group. Examples of suitable acids or anhydrides are halogenated phthalic anhydrides or acids such as tetrachlorophthalic anhydride and dichlorophthalic anhydride; and halogenated isophthalic and terephthalic anhydrides and acids such as the corresponding dichloro and trichloro compounds. Suitable halogens are chlorine, bromine and iodine, with chlorine being preferred.

Useful polyols include glycerol, diethylene glycol, tetraethylene glycol, propylene glycol, pentaerythritol and dipentaerythritol. Examples of polymeric stryene-allyl alcohols are resins RJ-100 and RJ-101 in the form of non-tacky flakes which are sold by Monsanto. These resins are soluble in alcohols, esters, ketones and aromatic hydrocarbons, the RJ-101 resin being soluble only in selected aromatic hydrocarbons. Some of the more important properties of these resins are listed below:

|  | RJ-100 | RJ-101 |
| --- | --- | --- |
| hydroxyl content (wt. %) | 5.7 ± 0.3% | 7.7 ± 0.3% |
| specific viscosity | 0.65 ± 0.04 | 0.59 ± 0.04 |
| equivalent weight | 300 ± 15 | 220 ± 10 |
| molecular weight |  |  |
| (no. avg.) | 1600 | 1150 |
| (wt. avg.) | 2340 | 1700 |
| Durran softening point | 100–110° | 95–105° |
| specific gravity | 1.055 | 1.094 |

The organic polyacrylates contain from 2 to 5 acrylate groups and are acrylic esters of polyols. The polyols contain from 2 to 20, preferably from 4 to 10, carbon atoms and from 2 to 6 hydroxyl groups. Examples of suitable polyacrylates include dipentaerythritol monohydroxypenta-acrylate, hexanediol diacrylate and neopentylglycol diacrylate. The polyacrylate functions in the composition as a cross-linking agent which is activated by uv light.

The catalysts for the photoreaction of the saturated halogenated polyesters are metal acrylates, preferably divalent metal acrylates. Suitable metals include zinc, copper, tin, cobalt, manganese, cerium, molybdenum, iron, nickel, cadmium, magnesium, lead, silver, barium, calcium, and sodium. Preferred are zinc and calcium and especially zinc. This component serves to produce a harder film after exposure to uv light. It also imparts ink receptivity to the coating composition and provides intensity to the picture, i.e., better contrast after exposure of the coating composition.

Zinc diacrylate is soluble in our solvent system and as used herein, is a white powder of 325 mesh particle size, of 88% purity and 22 lbs./ft$^3$. bulk density.

The photoinitiator constituent of the coating composition may be selected from the well-known organic photoinitiators such as substituted anthraquinones and substituted benzions. Specific examples include $C_1$ to $C_5$ alkyl anthraquinones such as 2-methylanthraquinone and 2-ethyl-anthraquinone; 2-chloroanthraquinone; 1, 2-benzanthraquinone; benzil; benzoin, benzoin methyl or ethyl ether; alpha-methylbenzoin; alpha-phenylbenzoin; Michler's Ketone; benzophenone; and other well known initiators.

The coating composition described herein in applied onto the substrate in any suitable manner. Preferably, the compositions are dispersed in an inert organic solvent and applied by spraying or by means of a roller. When prepared for spraying, the dispersion of the composition should contain 8 to 10% solids whereas in the case it is to be applied by roller, the solids concentration should be about 40%. Preferred solvents include cellosolve, cellosolve acetate and water with alcohol. Also suitable are aromatic, chlorinated, ketone and nitrile solvents. Examples of less preferred solvents are cyclohexane, trichloroethylene, tetrachloroethylene, trichloroethanes, chlorobenzenes, propyl, butyl and amyl acetates or butyl butyrates, methylethyl, ketone, cyclohexanone, xylene, toluene and cumene.

For best results, the halogenated polyester should be modified with a benzene-type polycarboxylic acid or corresponding anhydride containing from 2 to 3 carboxylic groups or corresponding linkages. Amount of this component may vary from 2 to 35, preferably from 5 to 25, parts by weight of the halogenated polyester component including the modifier.

Examples of the modifying component are phthalic acids and their anhydrides and trimellitic acid and its anhydride. Preferred is trimellitic acid or its anhydride. In absence of this component, the coating composition is more difficult to develop which renders it more difficult to remove from the printing plate. This component is incorporated into the coating composition through the halogenated polyester by reacting it together with the other reactants which go into preparation of the polyester.

Other components may be added to impart desired properties to the coating composition as is well known in the art.

Paraffin oil may be added to the coating composition in amount of from 0.1 to 2.0%, preferably 0.2 to 0.7%, based on the active ingredients of the composition. The paraffin oil functions to impart to the coating a smooth level surface. Suitable paraffin oil has the following properties:

| | |
|---|---|
| flash point, Cleveland Open Cup | 330° F |
| fire point | 360° F |
| API gravity, 60/60° F | 24.5 |
| specific gravity 60/60° F | 0.9071 |
| pour point | −30° F |
| viscosity at 100° F, SSU | 95 |
| saponification No. | 0.7 |
| aniline point | 157° F |

As was already noted, the polyacrylate functions as a cross-linking agent. When the polyacrylate is included in the composition, storage life thereof may be in excess of 6 months. When it is desired to extend storage life of the composition, it can be prepared in two separate parts and the parts can be combined just prior to the application of the composition. The first part includes polyester, solvent, dye, metal acrylate, photoinitiator and paraffin oil, whereas the second part includes polyacrylate. Relative amounts may include 100 parts by weight of the first part and 19 parts of the second; 85 parts of the first and 15 parts of the second; etc.

A long run plate, composed of stainless steel and copper coated thereon, is prepared by applying the coating described herein onto the copper surface and drying it in an oven to remove essentially all of the solvent. After the coating has been dried, a negative print is applied thereover and that face of the plate is subjected to ultra-violet light to photopolymerize the coating at the exposed regions. Duration of exposure is dependent on type of lamp and distance from work. The plate is developed by washing out the unexposed areas with a developer thus leaving the polymerized coating on the plate. At this point, the working surface of the plate consists of copper and regions coated with the photopolymerized coating composition described herein. After development, the plate is rinsed with water to remove the developer, wiped with as with a squeegee, etched with a ferric chloride solution and rinsed with water. Etching with ferric chloride solution removes copper in the uncoated regions. This is followed by treatment with a 3% sulfuric acid counter etch solution which cleans the exposed steel, inking with proofing ink to provide better contrast to the printing surface and rinsing with water to remove the dilute sulfuric acid solution. As the final step, 10 to 14 Be (about 18% solids) gum solution is applied to seal the plate to prevent oxidation of steel. The gum arabic solution will not cover the printing areas.

In the case of a short run plate where the substrate may be aluminum or steel with no copper overlay, the coating is applied to the substrate, dried and exposed after a negative is interposed. The plate is then developed by washing out the nonexposed areas of the coating with a developer, rinsed, inked and gummed.

Generally, the compositions of the present invention can be allowed to dry in air to a sufficient hardness for exposure and further treatment. However, it is preferred to subject the coated substrates to drying in a convection over or other type oven with air flow. The drying step can be suitably carried out in 3 to 30 minutes at temperatures ranging from 150° to 300° F. This drying procedure is generally quite sufficient to render the coated polymer film thoroughly dry and sufficiently tough to be subjected to further processing.

The present photoresist compositions can be rendered partially or completely insoluble by exposure to actinic light. Actinic light is defined as the light in the violet and ultra-violet regions of the light spectrum that produces a chemical change. Any source of actinic light normally employed for imaging photosensitive compositions are suitable for imaging the present photoresist compositions. Such light sources as pulsed xenon lamps, ultraviolet or black light, mercury vapor lamps, carbon arc, incandescent bulbs or daylight can successfully be used. Because of the speed of exposure, it is preferred to use one of the strong sources of light such as those first enumerated above. When incandescent bulbs or daylight is employed, a longer exposure is usually required.

The invention described herein will now be illustrated by examples of the preferred embodiments.

EXAMPLE I - PREPARATION OF HALOGENATED POLYESTER

To prepare the polyester, 37.3 parts by weight of glycerol (1, 2, 3 -propanetriol), 31.0 parts of tetrachlorophthalic anhydride and 10.9 parts of dimethyl propionic acid were mixed and heated to 190° F. As is known to those skilled in the art, dimethyl propionic acid, or another suitable monocarboxylic acid, is added to control molecular weight of the polyester by restricting cross-linking between molecules which controls gelling.

After these components were dispersed to provide a homogeneous mass, 20.8 parts of trimellitic anhydride were added slowly to avoid undue foaming, following which, the mass was heated to 410° F and maintained at this temperature until a clear solid pill was obtained when a drop of the hot polyester was placed on a cold glass surface. The mass was then cooled to 380° F and stored. Acid number of this polyester was 26/28.

EXAMPLE II - PREPARATION OF HALOGENATED POLYESTER

In this instance, 23.6 parts by weight glycerol, 39.1 parts of tetrachlorophthalic anhydride and 8.2 parts trimellitic anhydride were mixed and heated to 380° F unitl the components were dispersed completely. Added slowly to avoid undue foaming was 29.1 parts of RJ-101 styrene allyl alcohol. The mass was then heated to 400° F and maintained at that level until a clear solid pill was obtained when tested on a cold glass surface. The mass was cooled to 380° F and stored. Acid number of this polyester was 26/30.

EXAMPLE III - PREPARATION OF PLATE COATING

A coating composition was prepared from components listed below, given on weight percent basis:

| | |
|---|---|
| cellosolve | 24.90 |
| cellosolve acetate | 22.00 |
| Sudan yellow dye | 0.10 |
| 2-ethylanthraquinone | 4.00 |
| zinc diacrylate | 3.00 |
| pentaerythritol tetracrylate | 10.50 |
| polyester of Ex. 1 | 27.64 |
| barium sulfate | 7.80 |
| zinc stearate | 0.05 |
| talc | 0.01 |
| | 100.00 |

Barium sulfate was added to make the coating harder and to improve clarity of the picture on the printing plate. Zinc stearate provides a dry feel to the surface of the plate and talc functions to lubricate the surface of the plate.

The coating composition was prepared by mixing the above components at room temperature for about 20 minutes until a good dispersion was obtained containing 53.1% solids.

EXAMPLE IV - PREPARATION OF PLATE COATING

The coating composition was prepared in two parts, Part A and Part B. In this way, the composition can be stored separately for longer periods of time. In this way, polyacrylate does not contribute to the tendency of the composition to cross-link and gel.

| Part A - 85 parts | |
|---|---|
| cellosolve | 29.50 |
| cellosolve acetate | 15.00 |
| Rhodamine 6GDN | 0.10 |
| 2-ethylanthraquinone | 5.00 |
| FC-430 | 0.20 |
| paraffin oil | 0.20 |
| polyester of Ex. II | 35.00 |

| Part B - 15 parts |
|---|
| pentaerythritol triacrylate |

EXAMPLE V - PREPARATION OF PLATE COATING

The coating composition was prepared as in Example III using components listed below in the amounts indicated:

| | |
|---|---|
| cellosolve | 27.30 |
| cellosolve acetate | 23.00 |
| Rhodamine 6GDN | 0.10 |
| 2-ethylanthraquinone | 4.00 |
| polyester resin of Example I | 30.00 |
| paraffin oil | 0.50 |
| pentaerythritol triacrylate | 15.00 |

EXAMPLE VI - PREPARATION OF PLATE COATING

This represents another coating composition which is prepared as in Example III from 100 parts of materials listed below in specified amounts on weight basis with 17.5 parts of dipentaerythritol monohydroxy pentaacrylate:

| | |
|---|---|
| cellosolve | 30.00 |
| cellosolve acetate | 21.30 |
| Rhodamine | 0.20 |
| zinc diacrylate | 6.00 |
| 2-ethyl anthraquinone | 5.25 |
| paraffin oil | 0.25 |
| polyester resin of Example I | 37.00 |

Depending on many factors such as type of paper, press conditions, quality of acid etch, and others, the photopolymerized coating composition described herein will give up to 100,000 impressions when applied to a bimetal plate of stainless steel coated with copper. After the coating is worn off, the copper will provide upwards of 2 million impressions. Trimetal plates have even longer working lives.

EXAMPLE VII - PREPARATION OF PRINTING PLATE

Part A of the negative plate coating included the following components, on weight basis:

| | |
|---|---|
| cellosolve | 30.00% |
| cellosolve acetate | 22.25 |
| Rhodamine | 0.10 |
| zinc diacrylate | 7.40 |
| 2-ethyl anthraquinone | 5.00 |
| paraffin oil | 0.25 |
| polyester resin of Example I | 35.00 |

Part A was prepared by mixing ingredients in a kady mill which was previously rinsed with cellosolve after thorough cleaning. The dispersion temperature of the mill was not allowed to exceed 125° F. The dispersion was cooled to 100° F and packed into lined kits through organdy.

A total of 119 parts by weight of Part A were combined with 19 parts by weight of Part B, which was dipentaerythritol monohydroxypentaacrylate, to prepare the coating composition.

A plate measuring 24-½ × 36-¼ composed of 0.012 thick steel sheet with a 0.0001 thick copper coating was treated by roller coating the copper surface with the coating composition described to a thickness of 5.5 grams per square meter. The coating was dried in a forced draft oven at 255° F for 6 minutes. A negative was applied to the coated plate and the plate was exposed to a 220 volt carbon arc lamp at a distance of 48 for 6 minutes. The exposure can also be effected in 90 seconds at a distance of 18 using an Addulux lamp with a Rutherford PCM unit.

The unexposed areas on the plate were washed out by brushing onto the plate developer having the following composition on weight percent basis:

| | |
|---|---|
| ADS-100 detergent | 2.0 |
| cellosolve acetate | 3.0 |
| cellosolve | 11.0 |
| N-methyl-2-pyrrolidone | 10.0 |
| water | 74.0 |

The detergent ADS-100 is sold by Mona Industries of Patterson, New Jersey and is a reaction product of mixed fatty acids and diethyl amine in respective ratio of 2:1 having an acid number of 45 to 50, alkali number of 115 to 125 and a pH of a 10% aqueous solution of 9.5.

Developing time for this plate was 1-½ minutes with one application of the developer. Following the development step, the plate was rinsed with tap water, squeegeed off and a ferric chloride etch, 46 Be solution, was spread evenly over the plate for 1-½ minutes before being removed with a squeegee. This was followed with a thorough rinse with tap water and a counter etch with 3% sulfuric acid solution. At this stage, the plate was ready for inking with any rub-up lithographic ink for facilitating a check on reproduction, particularly in fine halftones. Borden's LS-147-N ink was used. After inking, the plate was rinsed again with tap water and then gummed with 10 to 14 Be gum arabic solution to protect steel areas.

This plate was used in a printing press and produced over 100,000 impressions on the coating and over 1,000,000 impressions on the copper surface. When the plate was removed, it was still capable of producing good print quality.

As was already noted, a printing plate coated with the coating composition described herein does not require a baking step since drying by solvent elimination will suffice. With the prior art printing plates, baking was necessary. Whereas the prior art developers contained chlorinated solvents or highly volatile solvents, such as methyl ethyl ketone, the developer used on our printing plates is about three quarters water and about one-quarter solvent with a small amount of a detergent. Less volatile solvents are suitable such as cellosolve, cellosolve acetate, ethyl alcohol, methyl and butyl cellosolves, methyl carbitols, ammonium hydroxide, isopropanol alcohol, etc. Cellosolve is the preferred solvent because it is less volatile.

There is another important advantage of the invention described herein. The printing plate can be easily reworked by removing the coating with a developer and recoating the plate, which, to the best of our knowledge, is not possible with some prior art printing plates.

We claim:
1. A plate comprising a substrate and a photopolymerizable coating composition disposed thereon, the coating composition includes the following components dispersed in an inert organic solvent:
   a. 20 to 50%, by weight of (a), (b) and (c), of a saturated and halogenated polyester containing one phenyl group;
   b. 10 to 45%, by weight of (a), (b) and (c), of an organic polyacrylate;
   c. 5 to 15%, by weight of (a), (b) and (c), of a metal acrylate; and
   d. an effective amount of an organic photoinitiator to initiate cross-linking in response to actinic light.

2. Plate of claim 1 wherein the substrate is selected from metals, plastics and paper; the polyester is a reaction product of a halogenated benzene-type polycarboxylic acid or its anhydride with polymerized styrene-allyl alcohol or an alkylene or polyalkylene polyhydroxy compound containing from 2 to 6 reactive hydroxyl groups and from 2 to 22 carbon atoms per molecule; and the polyacrylate is an acrylic ester of polyols containing from 2 to 6 hydroxyl groups and from 2 to 20 carbon atoms per molecule.

3. Plate of claim 2 wherein the substrate is selected from metals; the polyhydroxy compound contains from 2 to 4 reactive hydroxyl groups and from 2 to 6 carbon atoms per molecule, the alkylene moiety of the compound containing from 2 to 6 carbon atoms; the polyol of the polyacrylate contains from 4 to 10 carbon atoms per molecule.

4. Plate of claim 3 wherein the polyester is a reaction product including from 2 to 35%, by weight of the polyester, of a modifier selected from benzene-type polycarboxylic acids or their anhydrides, the solvent being selected from cellosolve, cellosolve acetate, water and lower alkanols and mixtures thereof.

5. Plate of claim 3 wherein the substrate is 0.009 to 0.018 of an inch thick and includes a 5 to 15 mil coating layer selected from copper and chromium on which is disposed the coating composition, amount of the modifier is from 5 to 25% by weight and the modifier contains from 2 to 3 carboxylic groups or corresponding anhydride linkages, the halogen in the polyester is chlorine.

6. A plate comprising a substrate and a photopolymerizable coating composition disposed thereon comprising:
   a. 20 to 50%, by weight of (a), (b) and (c), of a polyester which is a reaction product of a halogenated acid selected from phthalic, isophthalic and terephthalic acids and anhydrides with a polyol selected from polymerized styrene-allyl alcohol or alkylene polyols containing from 2 to 6 reactive hydroxyl groups and from 2 to 22 carbon atoms per molecule;
   b. 10 to 45%, by weight of (a), (b) and (c), of polyacrylate containing from 2 to 5 acrylate groups selected from acrylic esters of polyols which contain from 2 to 6 hydroxyl groups and from 2 to 20 carbon atom per molecule;
   c. 5 to 15%, by weight of (a), (b) and (c), of a metal acrylate; and
   d. an effective amount of an organic photoinitiator to initiate cross-linking of the components in response to actinic light.

7. Plate of claim 6 wherein the alkylene polyols of the polyester contain from 2 to 4 hydroxyl groups and from 2 to 6 carbon atoms per molecule, the alkylene moiety containing from 2 to 6 carbon atoms; and wherein the polyols of the polyacrylate contain from 4 to 10 carbon atoms.

8. Plate of claim 6 wherein the polyol of the polyester is selected from glycerol, diethylene glycol, tetraethylene glycol, propylene glycol, pentaerythritol and dipentaerythritol; the polyacrylate is selected from hexanediol diacrylate, neopentylglycol diacrylate and dipentaerythritol monohydroxypenta acrylate.

9. Plate of claim 8 wherein the polyester further includes a modifier in amount of 2 to 35% by weight of the polyester components selected from benzene-type acids containing from 2 to 3 carboxylic groups and their anhydrides.

10. Plate of claim 9 wherein the modifier is from 5 to 25% by weight and it is selected from phthalic and trimellitic acids and their anhydrides.

11. Plate of claim 10 wherein amount of the polyester is from 25 to 40%, that of polyacrylate is 15 to 30% and that of metal acrylate is 6 to 10%.

12. Plate of claim 11 wherein the modifier is trimellitic acid or its anhydride and the metal acrylate is zinc diacrylate.

13. Plate of claim 12 wherein the photoinitiator is selected from $C_1$ to $C_5$ alkyl substituted anthraquinones and the substrate is 0.009 to 0.018 of an inch thick and includes a 5 to 15 mil coating layer selected from copper and chromium.

* * * * *